United States Patent [19]
Rasmussen et al.

[11] Patent Number: 6,143,076
[45] Date of Patent: Nov. 7, 2000

[54] APPLICATOR HEAD

[75] Inventors: Jay Rasmussen, Richardson; Matthew C. Smithers, Lewisville, both of Tex.

[73] Assignee: Thermalloy Inc., Dallas, Tex.

[21] Appl. No.: 08/877,944

[22] Filed: Jun. 18, 1997

Related U.S. Application Data

[63] Continuation-in-part of application No. 08/669,875, Jun. 21, 1996.

[51] Int. Cl.[7] ........................................................ B05C 3/02
[52] U.S. Cl. ............................................. 118/411; 118/315
[58] Field of Search ................................ 239/552, 553.5, 239/557, 590; 118/315, 411

[56] References Cited

U.S. PATENT DOCUMENTS

| | | | |
|---|---|---|---|
| 2,643,964 | 6/1953 | Smith-Johannsen | 428/266 |
| 2,711,382 | 6/1955 | Smith-Johannsen | 165/185 |
| 3,301,315 | 1/1967 | Webb | 165/185 |
| 3,509,429 | 4/1970 | Craig et al. | 165/185 X |
| 3,810,779 | 5/1974 | Pickett et al. | 117/37 |
| 3,972,821 | 8/1976 | Weidenbenner et al. | 165/185 X |
| 4,514,232 | 4/1985 | Ameen et al. | 134/1 |
| 4,550,681 | 11/1985 | Zimmer et al. | 118/410 |
| 4,602,678 | 7/1986 | Fick | 165/185 X |
| 4,622,239 | 11/1986 | Schoenthaler et al. | 118/410 |
| 4,747,541 | 5/1988 | Morine et al. | 118/315 |
| 5,168,926 | 12/1992 | Watson et al. | 165/185 |
| 5,681,392 | 10/1997 | Swain | 118/407 |
| 5,769,947 | 6/1998 | Krappweis | 118/411 |
| 5,824,155 | 10/1998 | Ha et al. | 118/410 |

FOREIGN PATENT DOCUMENTS

WO 95/02505   1/1995   WIPO.

OTHER PUBLICATIONS

Thermalloy, Inc. catalog, "The Best Thermal Management Solutions from Around the World", Nov., 1996, pp. A2–A7 and D9–D11.

LCC/Disensit®, Dispensit Model 1052, Rod Positive Displacement Dispense Valve, 3 pages.

*Primary Examiner*—Brenda A. Lamb
*Attorney, Agent, or Firm*—Cohen, Pontani, Lieberman & Pavane

[57] ABSTRACT

Heat sinks and electrical components pre-coated with a layer of a material such as thermal grease are disclosed. Contamination and migration of the thermal grease is substantially reduced by covering the coated areas with a release liner that is removed prior to the assembly of the heat sink into a circuit board or other assembly. By providing a pre-coated heat sink, productivity can be enhanced by increasing accuracy with which the thermal grease is applied, thus eliminating waste and clean up. Methods for pre-coating either a heat sink or the release liner with thermal grease are also disclosed. In preferred embodiments areas of the heat sink can be either fully coated, or portions electively coated, and the coating is most preferably accomplished by pushing grease through an applicator head that has numerous small nozzles. A system and method for dispensing grease either onto a heat sink, onto an electrical component capable of mounting to the heat sink, or onto a release liner that is later applied to the heat sink or electrical component is also disclosed. The release liner is preferably provided with a pull-off tab to facilitate the removal of the release liner. The present invention also discloses improved methods of installing a heat sink using heat sinks that are pre-coated with thermal grease.

11 Claims, 5 Drawing Sheets

APPLICATOR HEAD

This application is a continuation-in-part of U.S. Application Ser. No. 08/669,875, filed Jun. 21, 1996, which is incorporated herein by reference in its entirety.

The present invention relates to electronic component assemblies, and more particularly relates to the application of a substance such as thermally conductive grease between two components.

BACKGROUND OF THE INVENTION

The interface between a heat sink and the component to which it is attached includes small voids due to surface irregularities, roughness, and lack of flatness of the two surfaces. These voids reduce the thermal transmissivity to the heat sink, and thus ultimately reduce the ability of the heat sink to dissipate heat generated by the component. In the past, it has been found that applying a film of thermal grease can diminish or substantially eliminate this problem. Thermal grease is well known in the art and can be a composition of silicone and zinc oxide, available from Dow Corning of Midland, Mich. and other sources. Another thermal grease composition, THERMALCOTE™ is available from Thermalloy, Inc. of Dallas, Tex.; another a product sold by the same company and known as THERMALCOTE II™ does not contain silicone. The THERMALCOTE™ products are available in forms that are applied by brush, squeezed out of a tube, applied by a paddle, or other techniques. Unfortunately, the application of thermal grease to individual components in a production environment is laborious, and inexact. Nonetheless, despite numerous efforts to create another interface material to replace it, thermal grease remains the most effective product for ensuring good thermal conductivity.

Thermal grease can be applied directly to an insulator strip. The coated strip is supplied in a package that must be peeled away, and the insulator must then be applied to a component. This product is sold under the name INSUL-COTE by Thermalloy, Inc. of Dallas, Tex. Similarly, it is known to apply a thin layer of thermal grease to both sides of an aluminum carrier that is 0.1 mm (0.004") thick. The coated carrier is then disposed between a heat sink and a microprocessor. This product is sold under the name CONDUCTA-COTE(TM) by Thermalloy, Inc. of Dallas, Tex. However, the use of such coated insulators or aluminum carriers does not eliminate the above-mentioned problems, since handling the grease-coated insulation or carrier is nearly as difficult as applying the grease from a tube or with a brush. The insulators and carriers can be obtained in strip form and applied by a machine, which alleviates some of these problems. However, this adds a production step and the capital cost of the application machine if the supplier of the pre-coated insulators or carriers does not provide one. The advantage of pre-coated insulators or carriers is that they apply a specific amount of grease, and a specific quantity of grease may be purchased by ordering coated insulators or carriers on a one-to-one basis with the heat sinks. However, a disadvantage of the above-described pre-coated insulators and aluminum carriers that are pre-coated with thermal grease is that they are difficult to manufacture.

As mentioned above, others in the art have attempted to create pads of material that serve as a replacement for thermal grease. Some of these products are insulating, while some more recent versions are not. Although such pads reduce the waste and inaccurate application related to the use of a thermal enhancement product, they are often more expensive and do not offer the thermal performance of grease. Therefore, it would be desirable to provide a product in which the thermal properties of grease are advantageously available to create a better thermal connection between a heat sink and a heat-emitting component. Moreover, it would be further desirable to reduce or eliminate waste, spillage and over-application of thermal grease. It is therefore an object of the present invention to provide products and methods in which thermal grease is applied in a precise and controlled manner. It is a further object of the present invention to provide products and methods that readily adapt to production environments and that do not require significant alteration of existing production sequences or changes in production tooling.

It is yet a further object of the present invention to provide a system and method for applying a substantially precise amount of thermal grease in a predetermined pattern.

SUMMARY OF THE INVENTION

It has now been found that these and other objects of the present invention are met by pre-applying coatings and substances such as thermal grease to components such as heat sinks. The relevant area is covered with a protective sheet, e.g., a thin film or paper, termed a release liner. The assembler removes the protective sheet, preferably using a pull-off tab provided for that purpose. After the release liner is removed, the heat sink is assembled to a microprocessor or other semiconductor device, or any source of heat. Alternatively, the electrical component can be coated, or the release liner can be pre-coated and applied to the heat sink or to the electrical component. As used in this specification and the appended claims, the terms thermal grease and thermal compound are interchangeable.

The present invention therefore discloses heat sinks, electrical components, and protective release liners that are pre-coated with a layer of a material such as thermal grease that provide several advantages over the prior art. For one, contamination and migration of the thermal grease is substantially reduced by covering the coated areas with a release liner that is removed prior to the assembly of the heat sink into a circuit board or other assembly. By providing a pre-coated heat sink or electrical component, productivity is enhanced by increasing accuracy with which the thermal grease is applied, thus eliminating waste and clean up. The present invention is thus also directed to improved methods and systems for pre-coating the body of a heat sink or electrical component with thermal grease in which areas of the body can be either fully coated, or portions electively coated; alternatively, the release liner can be pre-coated. The coating is most preferably accomplished by forcing grease through an applicator head having a plurality of small nozzles.

The grease application system includes a support base and an applicator. Both the base and applicator have a mechanism for vertically adjusting the position of an applicator head disposed on the applicator. The applicator head has a reservoir and an array of holes with nozzles for dispensing a precise amount of grease in a predetermined pattern.

The release liner is most preferably provided with a pull-off tab to facilitate the removal of the release liner. Finally, the present invention also discloses improved methods of installing a heat sink using heat sinks that have an area where thermal grease is pre-applied and covered by a release liner.

DETAILED DESCRIPTION OF THE PREFERRED EMBODIMENTS

Figure 1:
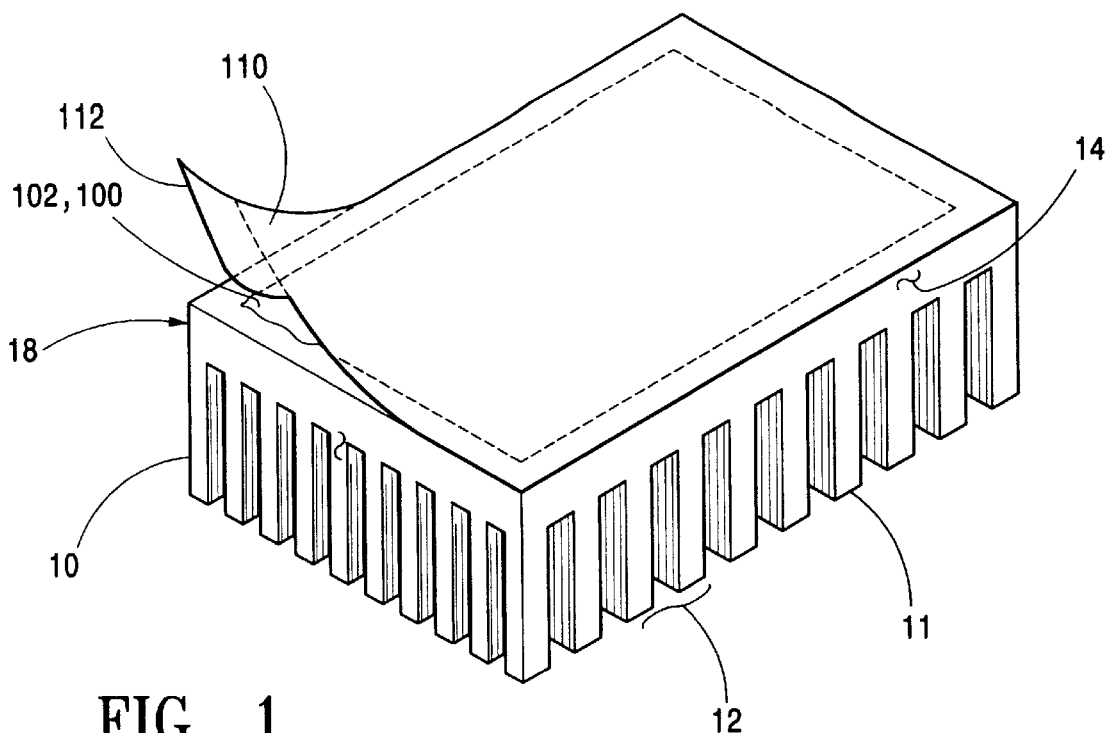
FIG. 1 is a perspective view of an embodiment of the present invention.

Referring now to FIG. 1, in a preferred embodiment, a heat sink 10 comprises a body 18 that includes a plurality of fins 11 extending from a heat dissipation side 12 and a component facing side 14. The component facing side 14 is covered with a layer of material 100 and a protective release liner 110 overlies the layer of material 100. For purposes of illustration, FIG. 1 shows one corner of the release liner 110 upturned to expose the layer of material 100. It will be understood, however, that the heat sink 10 is normally delivered with a sheet of protective material 110 overlying the layer of material 100. Moreover, it is understood that the present invention is not limited to the geometry of heat sink 10, shown in FIGS. 1 and 2, wherein heat dissipation side 12 and component facing side 14 are opposed. Specifically, the present invention encompasses heat sinks that have a body 18 of any shape and a component facing side 12 disposed on the body 18.

Although the present invention may be also employed with either a release liner or an electrical component that is suitable for mounting to a heat sink, for clarity the present invention is illustrated with reference to the heat sink type shown in FIG. 1.

The layer of material 100 most preferably comprises a thermal grease or a thermal compound, the use of which is well known in the art as discussed above. It will be realized, however, that thermal grease is not the only type of material that can utilize the concepts disclosed herein. Numerous other property enhancing coatings, such as conductive powders, gels, dispersions, etc. can be used, as well as compliant coatings that absorb shock. In FIG. 1, the layer of material 100 is shown in phantom except where the release liner 110 is again shown as being lifted up for purposes of illustration.

Figure 2:
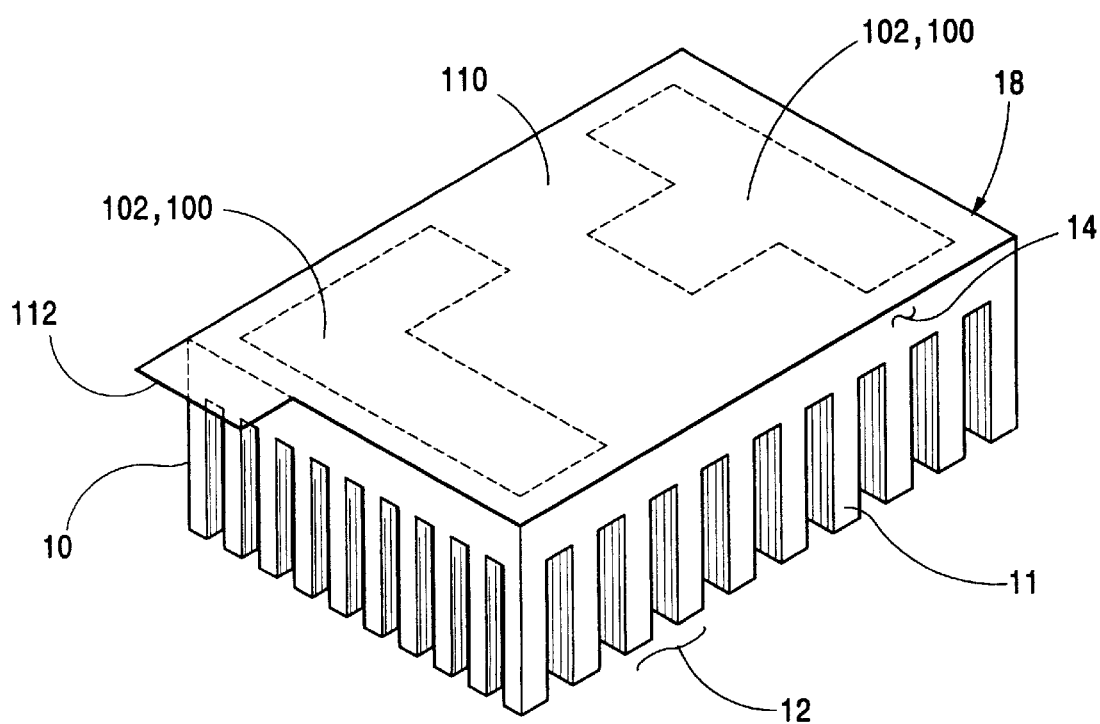
FIG. 2 is a perspective view of an alternate embodiment of the present invention.

In certain embodiments, layer of material 100 is applied over substantially the entire component facing side 14 as shown in FIG. 1. However, as seen in FIG. 2, the layer of material 100 alternatively can be applied over predetermined portions 102 of the component facing side 14.

In certain embodiments, release liner 110 is adhered to the layer of material at one or more edges of the component facing side 14. In the embodiment illustrated in FIG. 2 the areas 102 that are coated with the material 100 are shown in phantom. In either the embodiment of FIG. 1 or FIG. 2, it is shown that the release liner 110 overlies the entire component facing side 14, although it will be understood that the present invention contemplates embodiments in which the release liner 110 is discontinuous, made of several sections, slit, perforated, or otherwise does not cover the entire component facing side 14. In certain embodiments, at least a portion of the release liner 110 extends beyond an edge of the heat sink 10. A portion of the release liner 110 extends beyond an edge of the heat sink 10 and forms a pull-off removal tab 112. Release liner 110 may also be smaller than the surface 14 of heat sink 10 such that removal tab 112 or a corner of release liner 110 lacks adhesive (as will be explained more fully below), thereby enabling grasping of release liner 110.

The present invention contemplates that the release liner 110 can be made from any suitable material. As will be readily appreciated by those of skill in the art, suitable materials include those that are easily released from the component, that resist deterioration due to exposure with the thermal grease, and those that resist absorption of the thermal grease, in order to keep the external packaging free of contamination and to preserve the precise quantity of grease that has been applied. Preferably, the release liner 110 comprises an opaque paper product or film, but may also comprise a transparent material, such as MYLAR. Co-pending U.S. patent application Ser. No. 08/878,092, filed Jun. 17, 1997, entitled "Heat Sink Packaging Methods and Devices for Same," (Attorney Docket No. THRM-0074) which is assigned to the assignee of the present invention and which is incorporated herein by reference in its entirety, provides packaging members (which include release liner 110) for protecting thermal grease 100.

In another aspect of the present invention, improved methods of applying thermal grease to a heat sink are provided. In a preferred embodiment, the method of the present invention comprises the steps of identifying or predetermining an area 102 to receive thermal grease 100 and applying thermal grease 100 to area 102 through an applicator head 26, as described more fully below. The thermal grease is then covered with a packaging member. An alternative method according to the present invention includes applying thermal grease 100 to predetermined areas 102 of the release liner 110, and then applying the coated liner 110 to the heat sink 10 (or similar component) such that the grease coated side of the liner 110 comes into contact with the heat sink 10. The method according to the present invention encompasses coating a surface of an electrical component (not shown) prior to mounting the component and heat sink 10 together. The method may be employed with any electrical component that is suitable for combining with a heat sink, including for example microprocessors, rectifiers, converters, power supplies, and the like.

According to another aspect of the present invention, release liner 110 or surface 14 may be coated with an adhesive 19, as shown in FIGS. 1 and 2. On areas of contact between the release liner 110 and surface 14 that lacks grease 100, the adhesive will hold release liner 110 and heat sink 10 (or electrical device) together. Adhesive 19 may be formed of any suitable material, and may be applied in any manner, that enables release liner 110 to be removed from heat sink 10 when heat sink 10 is ready for installation.

Figure 3:
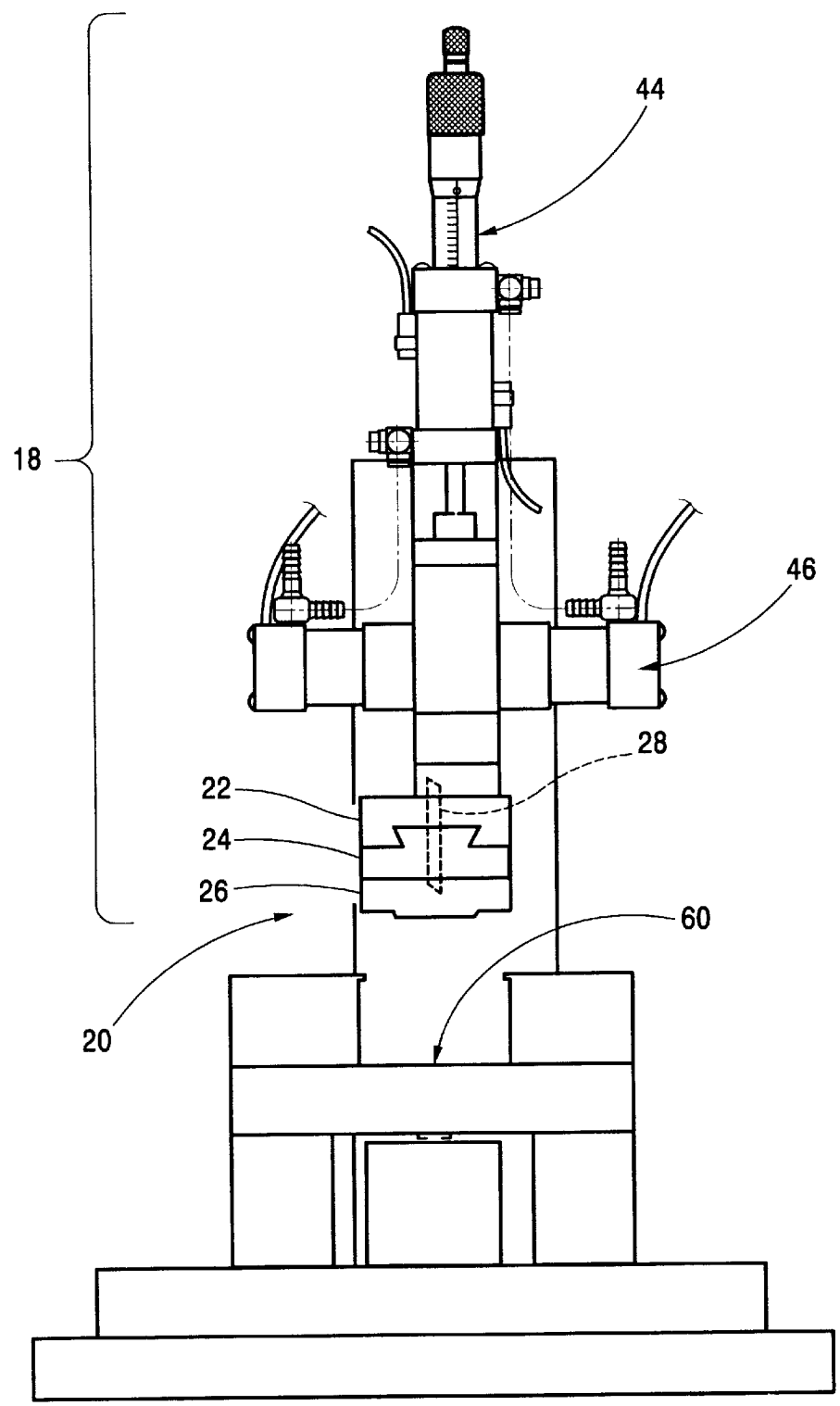
FIG. 3 is a front view of a system for applying thermal grease according to the present invention.
Figure 4:
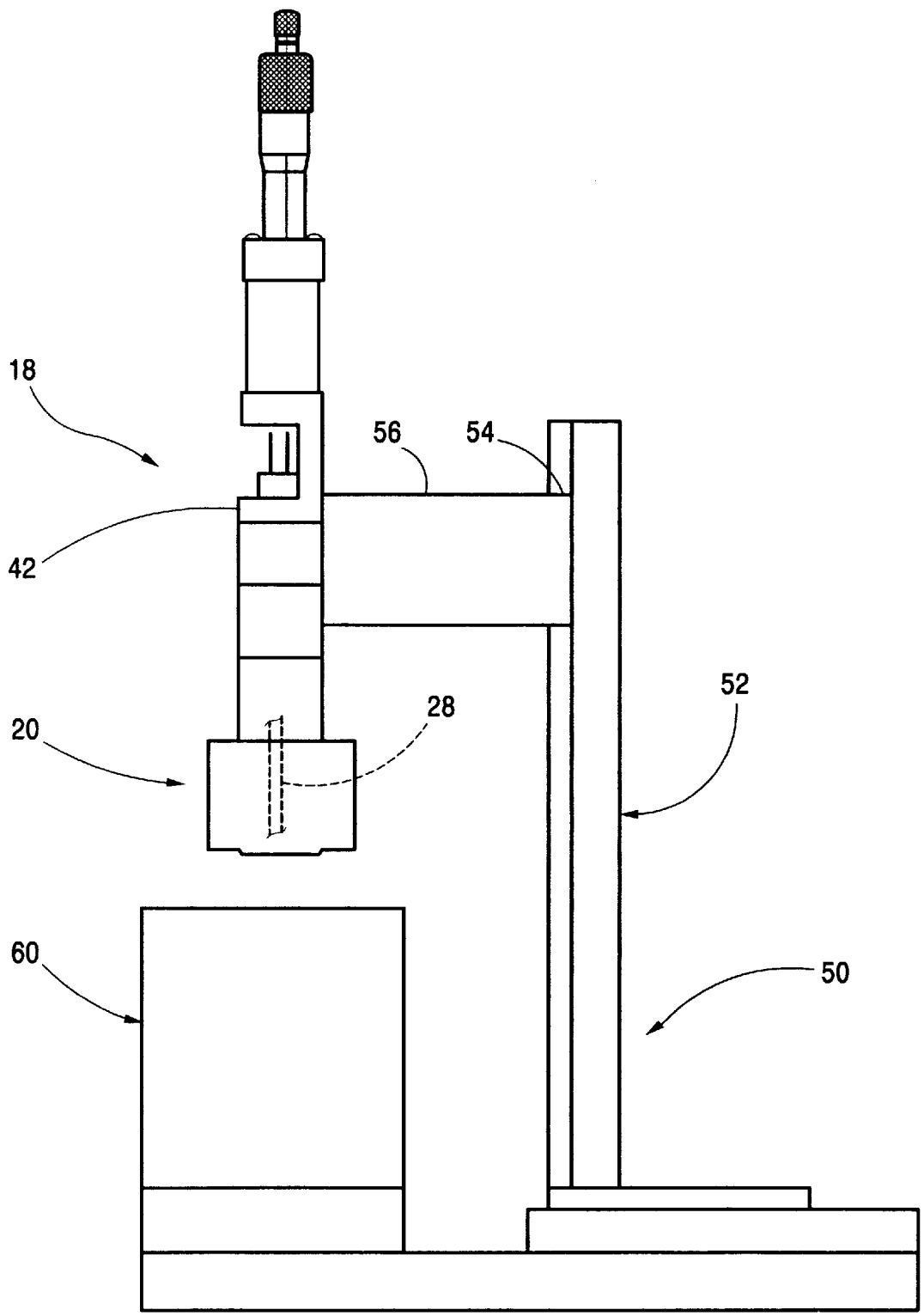
FIG. 4 is a side view of the system of FIG. 3.

In yet another aspect of the present invention, a system for dispensing a layer of thermal grease, shown in FIGS. 3 and 4, comprises an application system 18, a support base 50, and a component holder 60.

Base 50 supports application system 18, and includes an arm 56 and a vertical member 52 that has a vertical slot 54. Arm 56 has one end attached to application system 18 and another end coupled to vertical member 52 proximate vertical slot 54. Arm 56 may be positioned at various vertical positions along vertical member 52, thereby forming a vertical adjustment mechanism. Arm 56 is coupled to slot 54 by conventional means, such as bolting and clamping.

Application system 18 includes an applicator 20, a grease supply line 28, an application system support structure 42, a manual grease control mechanism 44, and a pressurizing means 46 for pressurizing the thermal grease. Support structure 42 is coupled to arm 56 and supported therefrom. Applicator 20 is coupled to support structure 42. Grease control mechanism 44, which is also supported by structure 42, preferably has fine screw threads that enable precise adjusting of a cavity (not shown) volume disposed within pressurizing means 46, as will be described more fully below.

The applicator 20 according to the present invention preferably includes a first adapter 22, a second adapter 24, and an applicator head 26. The first adapter 22 and second adapter 24 are oppositely keyed together in an interlocking relationship. The adapter head 26 bolts to the second adapter 24. The first adapter 22, second adapter 24, and applicator head 26 each have a passage that mutually align when the components are fully assembled to form grease supply line 28. For convenience, the entire grease pathway throughout system 18 will be referred to as supply line 28.

Figure 5:
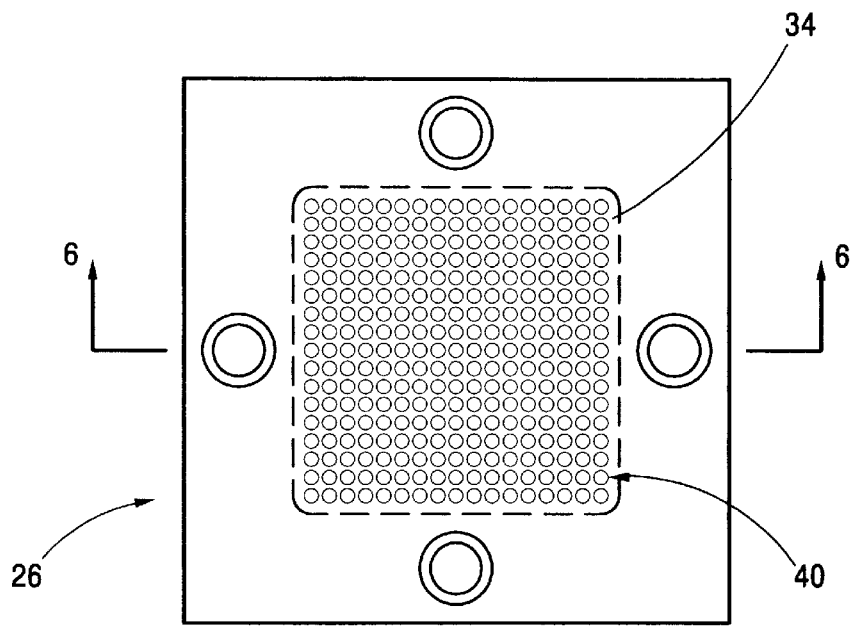
FIG. 5 is a view of the applicator head according to an aspect of the present invention.
Figure 6:
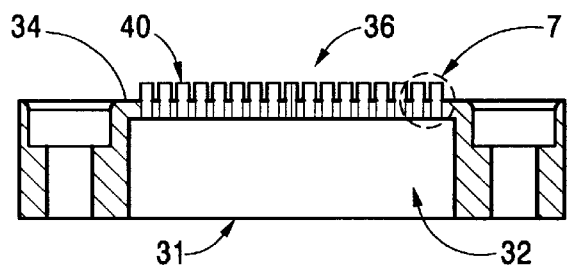
FIG. 6 is a sectional view of the applicator head shown in FIG. 5.
Figure 7:
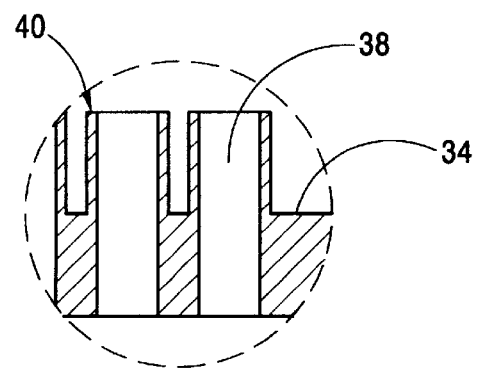
FIG. 7 is a detail of FIG. 6 that shows the nozzle.

Referring particularly to FIGS. 5 and 6, the applicator head 26 according to the present invention includes a head inlet 31, a reservoir 32, a nozzle sheet 34, and a head outlet 36. As best shown in FIG. 7, nozzle sheet 34 has an array of holes 38 disposed therethrough that enable grease to flow from reservoir 32 to outlet 36 in response to pressurization, which will be described hereinbelow. Preferably, nozzle sheet 34 includes an array of nozzles 40, which are disposed such that each nozzle 40 aligns with a hole 38. The outlet of nozzles 40 form head outlet 36. Employing the nozzles 40 is advantageous for uniformly transferring the grease to the component 10.

Preferably, each of the holes 38 and nozzles 40 have an inner diameter of approximately 0.040", and are spaced apart approximately 0.073" (measured center-to-center). Preferably, the nozzle outer diameter is approximately 0.060" and the nozzle length is approximately 0.075" measured from the outer surface of the nozzle sheet to the nozzle outlet. However, these diameters and spacings are for illustrative purposes and may vary according to grease viscosity, desired coating thickness, grease flow rate and pressure, and other process variables as will be understood by those familiar with the particular grease properties and use. Moreover, although FIG. 5 shows a square array of 289 nozzles, this shape and quantity are also for illustrative purposes and may vary according to the size of the component area desired to be coated and other variables, as will be understood by those familiar with the particular component and use. Specifically, the applicator head 26 shape may correspond to any area desired to be coated.

Pressurizing means 46 preferably comprises at least one positive displacement pneumatic pump, as shown in FIG. 3. Grease control mechanism 44 adjusts the volume of a round, vertical cavity (not shown) within pressurizing means 46. A volume of grease equal to the cavity size is dispensed onto each heat sink surface 14 upon one actuation of the air-actuated, positive displacement pump of pressurizing means 46. Pressurizing means 46 will be easily understood by those familiar with such air pumps. The present invention, however, may encompass any conventional means for regulating the flow of the thermal grease, including for example intermittently opening a normally closed orifice valve, an adjustable pump cylinder that is capable of controlling the amount of grease that is moved with each pump actuation or by varying the pump stroke rate, as well as manually or automatically adjusting a control valve. Grease control mechanism 44 and pressurizing means 46 are preferably DISPENSIT Model 1052 as supplied by LCC/DISPENSIT of Indianapolis, Ind.

Figure 8:
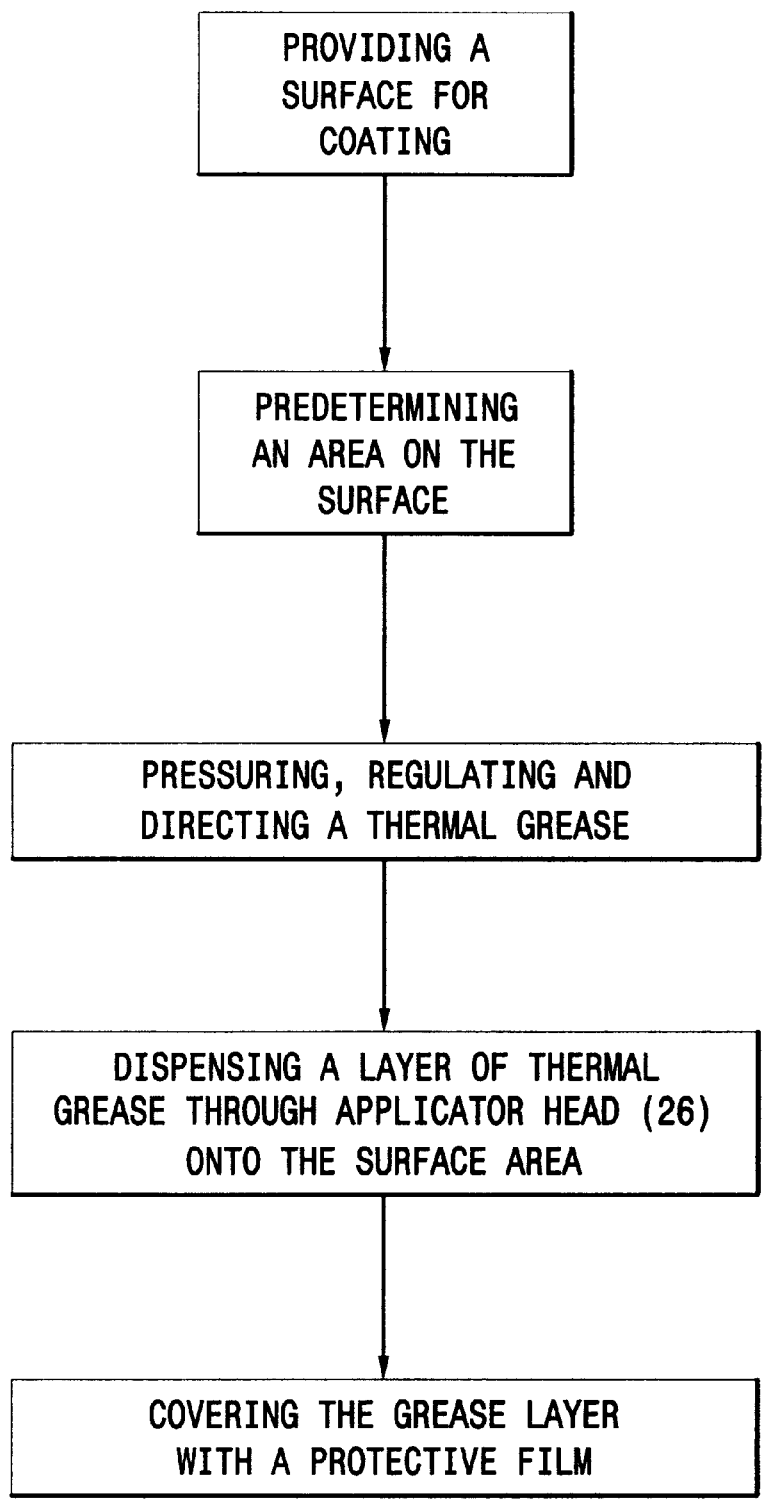
FIG. 8 is a flow chart illustrating the method according to the present invention.

The operation of the application system will now be described in conjunction with the description of the method according to the present invention, as illustrated in FIG. 8. Because the method according to the present invention may be employed with a heat sink 10, a release liner 110, or an electrical component (not shown), the description of the method herein applies to all of these items. Likewise, surface 14 includes the corresponding surface capable of receiving grease 100 of either heat sink 10, liner 110, or an electrical component. Thermal grease is pressurized by the pressurizing means 46, which urges a desired amount of thermal grease through the supply line 28. The amount of grease applied to the heat sink is controlled by fine adjustments on the grease control mechanism, which adjusts the size of a cavity that is internal to pressurizing means 46. A rod (not shown) pushes grease from the cavity (not shown), upon actuation of one of the air cylinders of pressurizing means 46, into a lower cavity (not shown). One of the two air cylinders pushes the thermal grease through first adapter 22 and second adapter 24 via supply line 32. The volume of the cavity is dispensed with each actuation of one of the air cylinders, which occurs once for each heat sink to be coated.

Thermal grease flows into reservoir 32, through nozzle sheet 34 via nozzles 40, and onto component surface 14. The grease substantially fills most of reservoir 32 before flowing through nozzles 40 because of pressure drop across nozzles 40. Reservoir 32, therefore, enhances uniformity of the grease flow rate through nozzles 40 and provides a substantially uniform thickness of grease layer 100 on surface 14. Alternatively, thermal grease may be applied to a surface of the release liner 110, which is later applied to the component surface 14.

Heat sink 10 (or release liner 110 or an electrical component—not shown) may be positioned by hand on holder 60, or such positioning may be automated. Preferably, the desired gap between applicator head outlet 36 and surface 14 is between 0.008" and 0.010", and the surface 14 and head 36 should be parallel to within 0.002" across surface 14. To obtain the desired gap between component surface 14 and applicator head outlet 36, arm 56 may be adjusted on slot 54 to precisely position applicator 20 to a desired vertical location, and holder 60 may be aligned. Component 10 may pass beneath applicator 20 in a vertical plane or may be horizontally moved in place by component holder 60. The determination of the thickness of the coating can be easily determined by trial and error, and will not require undue amounts of experimentation.

Coating techniques include silk screening and pad printing. In pad printing, a rubber pad or other suitable carrier is coated with grease and applied to either the component or the release liner. When the pad is removed, a "printed" area of thermal grease will be deposited in the appropriate area. The applicator head 26 of the present invention is a novel form of such a pad, and the present inventive method is a novel form of pad printing.

Regardless of the method of application, the present invention contemplates methods wherein discrete areas are selectively coated, as well as methods in which an entire surface of a component is coated. After the grease has been applied, the step of covering the thermal grease is undertaken, and this preferably comprises applying a plastic film, coated paper or other film over the thermal grease.

Additionally, as explained above, although it is preferred that the component be coated with thermal grease, applications are envisioned wherein the release liner will be coated first, and then the coated liner applied to the component.

Another aspect of the present invention is the disclosure of improved methods for installing a heat sink. In accordance with this aspect of the present invention, a protective backing is removed from the heat sink, and the heat sink is installed. Preferably, the step of removing a protective backing comprises the step of grasping a pull-off tab, which, as discussed above, is supplied with preferred embodiments of the present invention.

It will be understood that although the foregoing description of the preferred embodiments of the present invention focused upon the application of a material such as thermal grease to a heat sink, and then applying a release liner over the thermal grease, the present invention is equally applicable to and is directed to embodiments wherein the release liner 110 is first coated, continuously or discontinuously, with a coating such as thermal grease, and then the release liner 110 or a portion of it is applied to the back of a component such as a heat sink.

Although certain embodiments of the present invention have been disclosed and described with particularity, these embodiments are provided for the purpose of illustrating the invention and are not meant to be limiting. Upon review of the foregoing specification, those of skill in the art will immediately realize that numerous variations, modifications and adaptations of the invention are possible. Although differing in form and function, such alternate embodiments will employ the spirit of the present invention and are encompassed by the same. Accordingly, reference should be made to the appended claims in order to determine the full scope of the present invention.

What is claimed is:

1. A system for applying a layer of thermal grease, comprising:

a surface of least one of a heat sink, a release liner, and an electrical component capable of mounting to the heat sink, the surface having a predetermined area for receiving the thermal grease thereon;

a pressuring system for pressurizing the thermal grease;

a thermal grease supply line for directing the thermal grease, said supply line coupled with said pressurizing means; and, an applicator head dispensing a layer of thermal grease, said applicator head coupled with said thermal grease supply line, and having an inlet coupled to the thermal grease supply line, an outlet disposed proximate the surface, and a nozzle sheet disposed between the inlet and the outlet, the nozzle sheet having a multiplicity of holes formed therethrough that enable thermal grease flow communication between the head inlet and the head outlet and having a multiplicity of nozzles disposed on the nozzle sheet that project downwardly therefrom, the nozzles aligned with the holes to form an array that is similarly shaped to the predetermined area, whereby the nozzles dispense the thermal grease onto the predetermined area.

2. The applicator head of claim 1, wherein each of the multiplicity of holes has a center that is spaced apart from a center of at least one neighboring hole by between approximately 0.023 inch and 0.123 inch.

3. The applicator head of claim 1 wherein each one of the multiplicity of holes has a center that is spaced apart from a center of at least one neighboring hole by approximately 0.073 inch.

4. The system of claim 1 wherein each one of said multiplicity of holes has an inner diameter of between approximately 0.010 and 0.100 inches.

5. The system of claim 1 wherein each one of said multiplicity of holes has an inner diameter of approximately 0.040 inch.

6. The system of claim 1 further comprising a reservoir for substantially evenly distributing thermal grease to the multiplicity of holes, said reservoir disposed between the head inlet and the nozzle sheet.

7. The system of claim 1 wherein each one of the nozzles is substantially tubular such that each one of the nozzle outlets is spaced apart from adjacent ones of the nozzle outlets and from the nozzle sheet, whereby the nozzles uniformly dispense the thermal grease.

8. The system of claim 7 wherein each one of the nozzles communicates with only one hole.

9. The applicator head of claim 7 wherein each one of the holes is substantially circular and each one of the nozzles has a substantially circular cross-section.

10. The applicator head of claim 1 wherein the array is a rectangular array.

11. The applicator head of claim 1 wherein the array is a square array.

* * * * *